United States Patent
Yang

(10) Patent No.: US 6,713,344 B2
(45) Date of Patent: Mar. 30, 2004

(54) SEMICONDUCTOR DEVICE AND METHOD FOR MANUFACTURING THE SAME

(75) Inventor: Bee-Lyong Yang, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/288,455

(22) Filed: Nov. 6, 2002

(65) Prior Publication Data

US 2003/0094643 A1 May 22, 2003

(30) Foreign Application Priority Data

Nov. 20, 2001 (KR) .................................. 2001-0072308

(51) Int. Cl.[7] .......................................... H01L 21/8242
(52) U.S. Cl. ........................... 438/240; 438/3; 438/250; 438/256; 438/393
(58) Field of Search .......................... 438/3, 239, 240, 438/250, 251, 252, 393, 394, 395, 253, 254, 255, 256, 396, 397, 398, 399

(56) References Cited

U.S. PATENT DOCUMENTS

2002/0149040 A1 * 10/2002 Sun et al. .................. 257/295

FOREIGN PATENT DOCUMENTS

KR     2001-4298     1/2001     ......... H01L/27/108

* cited by examiner

*Primary Examiner*—Jack Chen
(74) *Attorney, Agent, or Firm*—Jacobson Holman PLLC

(57) ABSTRACT

The present invention provides a semiconductor device and a manufacturing method capable of preventing penetration of plasma with impurities into an interface between an inter-layer insulation layer and a diffusion barrier, thereby reducing degradation of the capacitor properties and increasing production yield. The inventive semiconductor device, including: a capacitor formed on a top portion of a semiconductor substrate, wherein the capacitor includes a bottom electrode, a dielectric layer and a top electrode; an Iridium (Ir) capping layer formed on the top electrode of the capacitor; an inter-layer insulation layer for covering the capacitor and the Ir capping layer; a Ti layer for preventing plasma with impurities from penetrating into the capacitor through a contact hole, wherein the Ti layer is contacted with the inter-layer insulation layer exposed on lateral sides of the contact hole and the Ir capping layer exposed on a lower side of the contact hole; and a metal line formed on the Ti layer.

7 Claims, 4 Drawing Sheets

SEMICONDUCTOR DEVICE AND METHOD FOR MANUFACTURING THE SAME

FIELD OF THE INVENTION

The present invention relates to a semiconductor device and a method for manufacturing the same; and, more particularly, to a semiconductor device and a manufacturing method capable of preventing diffusion of impurities such as hydrogen ions or moisture produced during a process using plasma.

DESCRIPTION OF RELATED ARTS

As a semiconductor device manufacturing technology has been rapidly developed, it is a trend in today to produce a semiconductor device with high degrees of capacity and function. Therefore, it is required to integrate more devices in a limited area, and this factor results in a continuous research and development to form a pattern on a semiconductor substrate to be highly micronized and integrated.

Plasma dry etching technique or plasma enhanced chemical vapor deposition technique is employed to fabricate a semiconductor device with high degrees of micronization and integration. In case of the plasma dry etching technique, a reactant gas is activated to be changed into a plasma state, and then positive ions or radicals of the plasma etch a target layer.

According to different types of plasma generation, a chamber in which a plasma process proceeds is classified into Reactive Ion Etching (RIE), Magnetically Enhanced Reactive Ion Etching (MERIE), Chemical Downstream Etching (CDE), Electron Cyclotron Resonance (ECR), and Transformer Coupled Plasma (TCP) and so on. Also, according to different types of power supply, the chamber can be also classified as Capacitive Coupled Plasma (CCP) and Inductive Coupled Plasma (ICP).

The CCP type forms an electric field by selectively supplying a high frequency power to a plurality of electrodes equipped inside a process chamber so as to change a reactant gas into a plasma state. The ICP type changes a reactant gas into a plasma state through the use of a magnetic and an electric fields generated by selectively supplying a high frequency power to a plurality of coils wound outside a process chamber and a plurality of electrodes equipped inside the process chamber.

In an etching and a deposition processes that use plasma, it is inevitable to use gases including impurities in high energy states, e.g., hydrogen ions, moisture, electrons or argon ions, and plasma containing these impurities gets penetrated inside a device such as a capacitor and the like, causing properties of the device to be degraded.

Figure 1:
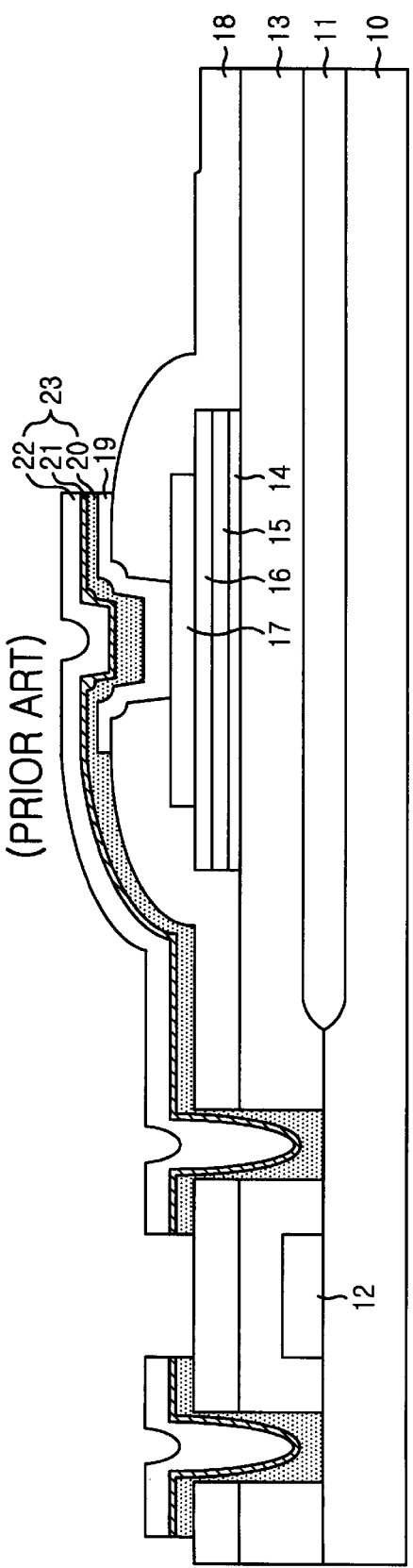

With reference to FIG. 1, there are described a method for manufacturing a capacitor of a semiconductor device.

Referring to FIG. 1, a first inter-layer insulation layer 13 is formed on a semiconductor substrate 10 on which a device isolation layer 11 and a transistor including a gate pattern 12 are formed.

Next, a capacitor including a bottom electrode 15, dielectric layer 16 and a top electrode 17 is formed on the first inter-layer insulation layer 13. Reference numeral 14 denotes an adhesion layer for improving adhesion between the first inter-layer insulation layer 13 and the bottom electrode 15.

A second inter-layer insulation layer 18 is then formed over the semiconductor substrate 10 after forming the capacitor. Subsequently, the second inter-layer insulation layer 18 is selectively etched to expose the top electrode 17. Then, a TiN diffusion barrier 19 contacted to the top electrode 17 is formed.

A metal line is formed for connecting the capacitor and an active area of the transistor. The metal line includes sequentially formed layers of a Ti layer 20, a TiN layer 21 and a metal layer 22.

As illustrated in FIG. 1, the TiN diffusion barrier 19 is formed on between the top electrode 17 and the Ti layer 20. The TiN diffusion barrier 19 functions to prevent degradation of capacitor properties, caused by a Ti penetration through a grain boundary of the top electrode 17 when the Ti layer 20 makes a direct contact to the top electrode 17.

In a reactive ion etching (RIE) process, plasma is particularly used for patterning the TiN diffusion barrier 19. However, impurities in high energy states contained in the plasma, e.g., hydrogen ions, moisture, electrons and argon ions and so forth, get penetrated into the capacitor, inducing degradation of the capacitor properties. These impurities are usually penetrated through an interface between the second inter-layer insulation layer 18 and the TiN diffusion barrier 19.

Hence, it is important to prevent impurities from penetrating into the capacitor to reduce degradation of the capacitor properties. It is, therefore, required to develop a plasma process and a subsequent process in which impurities such as hydrogen ions or moisture are not produced during these processes. However, there still present technical difficulties and cost problems to develop the above mentioned processes.

SUMMARY OF THE INVENTION

It is, therefore, an object of the present invention to provide a semiconductor device and a manufacturing method capable of preventing impurities with high energy states contained in plasma from penetrating into a capacitor, and thereby, ultimately maintaining properties of the semiconductor device.

In accordance with an aspect of the present invention, there is provided a semiconductor device, including: a capacitor formed on a top portion of a semiconductor substrate, wherein the capacitor includes a bottom electrode, a dielectric layer and a top electrode; an Iridium (Ir) capping layer formed on the top electrode of the capacitor; an inter-layer insulation layer for covering the capacitor and the Ir capping layer; a Ti layer for preventing plasma that contains impurities from penetrating into the capacitor through a contact hole, wherein the Ti layer is contacted with the inter-layer insulation layer exposed on lateral sides of the contact hole and the Ir capping layer exposed on a lower side of the contact hole; and a metal line formed on the Ti layer.

In accordance with another aspect of the present invention, there is also provided a method for manufacturing a semiconductor device, including the steps of: forming a capacitor including a bottom electrode, a dielectric layer and a top electrode on a semiconductor device; forming an Ir capping layer on the top electrode of the capacitor; forming an inter-layer insulation layer covering the Ir capping layer and the capacitor; forming a contact hole by selectively etching the inter-layer insulation layer, wherein the inter-layer insulation layer is exposed at the lateral side of the contact hole and the Ir capping layer is exposed at the bottom surface of the contact hole; forming a Ti layer for preventing plasma containing impurities from penetrating into the capacitor, wherein the Ti layer is contacted to the Ir capping layer at the bottom surface of the contact hole and the inter-layer insulation layer at the lateral side of the contact hole; and proceeding a process using the plasma.

In accordance with still another aspect of the present invention, there is also provided a method for manufacturing a semiconductor device, including the steps of: preparing a semiconductor substrate on which a transistor including a gate insulation layer, a gate electrode and junctions are already formed; forming a first inter-layer insulation layer on the semiconductor substrate; forming a capacitor including a bottom electrode, a dielectric layer and a top electrode on the first inter-layer insulation layer; forming an Ir capping layer on the top electrode of the capacitor; forming a second inter-layer insulation layer on the semiconductor substrate; forming a first contact hole by selectively etching the second inter-layer insulation layer, wherein the Ir capping layer is exposed at the bottom surface of the first contact hole and the second inter-layer insulation layer is exposed at the lateral side of the first contact hole, and forming a second contact hole by selectively etching the first and the second inter-layer insulation layers, wherein the junction of the transistor is exposed; forming a Ti layer for preventing plasma with impurities from penetrating into the capacitor, wherein the plasma contacts to the Ir capping layer at a bottom surface of the first contact hole and the second inter-layer insulation layer at the lateral side of the first contact hole, and the Ti layer making an ohmic contact by contacting to the junction exposed at a bottom surface of the second contact hole; forming a TiN layer on the Ti layer; and forming a metal line on the TiN layer.

In summary, instead of forming a TiN layer right after forming a contact hole that exposes a top electrode of a capacitor, Ti and TiN layers are stacked to form the Ti layer for an ohmic contact with an active area of a transistor of the capacitor. This Ti layer executes an iridium (Ir) capping layer that covers the top electrode to directly contact to an inter-layer insulation layer at lateral sides of a contact hole, and thus, the impurities in high energy states are set to be absorbed on the Ti layer, thereby fundamentally preventing penetration of the plasma with impurities into the capacitor. Accordingly, the Ir capping layer is formed on the top electrode to prevent the degradation of the capacitor property, which occurs because of a direct contact between the Ti layer and metals used for the top electrode.

BRIEF DESCRIPTION OF THE DRAWINGS(S)

The above and other objects and features of the present invention will become apparent from the following description of the preferred embodiments given in conjunction with the accompanying drawings, in which:

FIG. 1 illustrates a capacitor structure of a semiconductor device in accordance with the prior art; and FIGS. 2A to 2E are cross-sectional views depicting a capacitor manufacturing process of a semiconductor device in accordance with a preferred embodiment of the present invention.

DETAILED DESCRIPTION OF THE INVENTION

Other objects and aspects of the invention will become apparent from the following description of the embodiments with reference to the accompanying drawings, which is set forth hereinafter.

FIGS. 2A to 2E are cross-sectional views depicting a capacitor manufacturing process in accordance with a preferred embodiment of the present invention.

Figure 2A:
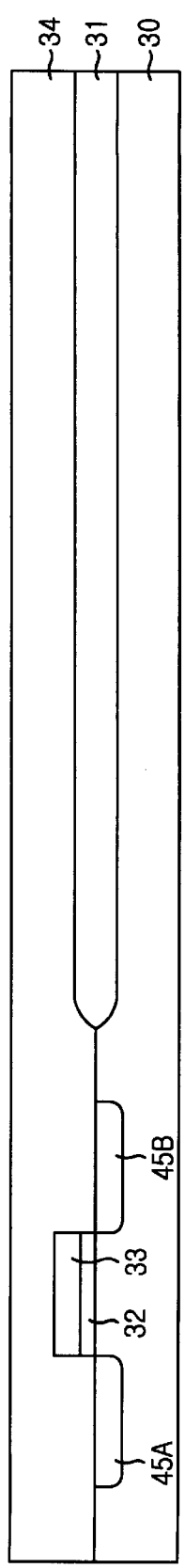

Referring to FIG. 2A, a semiconductor substrate is provided with a device isolation layer 31 and a transistor, which includes a gate insulation layer 32 and a gate electrode 33, a first junction 45A and a second junction 45B. A first inter-layer insulation layer 34 is formed by stacking a sequential order of a borophospho silicate glass (BPSG) film and a medium temperature oxide (MTO) film.

Figure 2B:
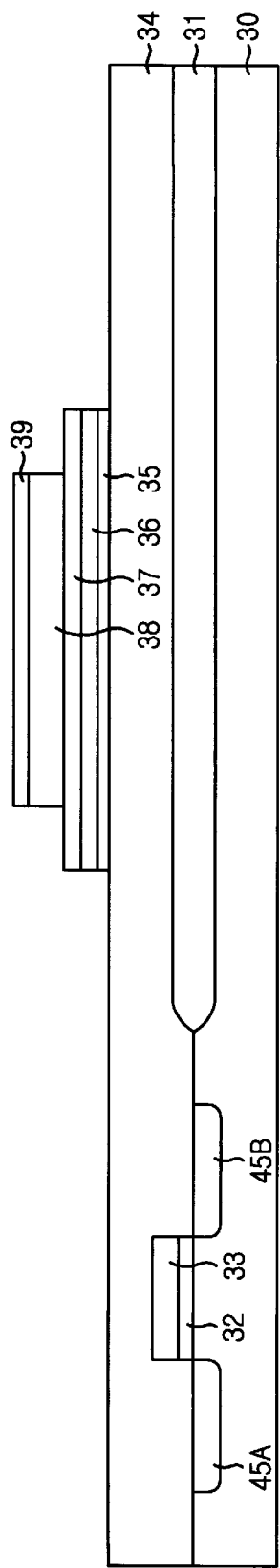

As shown in FIG. 2B, a Ti adhesion layer 35 is formed on the first inter-layer insulation layer 34, and a capacitor including a bottom electrode 36, a dielectric layer 37 and a top electrode 38 is formed on the Ti adhesion layer 35. Also, an iridium (Ir) capping layer 39 is formed on an upper portion of the top electrode 38. The Ti adhesion layer 35 has a thickness in a range from about 50 nm to about 250 nm, and the dielectric layer 37 has a thickness ranging from about 50 nm to about 250 nm with $SrBi_2Ta_2O_9$ (SBT), $Bi_{4-x}La_xTi_3O_{12}$ (BLT) based family or pb $(zr_xTi_{1-x})O_3$. The top electrode 38 is formed with pt to a thickness in a range from about 20 nm to about 200 nm. Also, the bottom electrode 36 is formed to a thickness in a range from about 20 nm to about 100 nm. Furthermore, the Ti adhesion layer 35, the bottom electrode 36 and the dielectric layer 37 are sequentially stacked and etched simultaneously. The top electrode 38 and the Ir capping layer 39 are also orderly stacked to be simultaneously etched wherein a thickness of the Ir capping layer ranges from about 20 nm to about 100 nm.

Figure 2C:
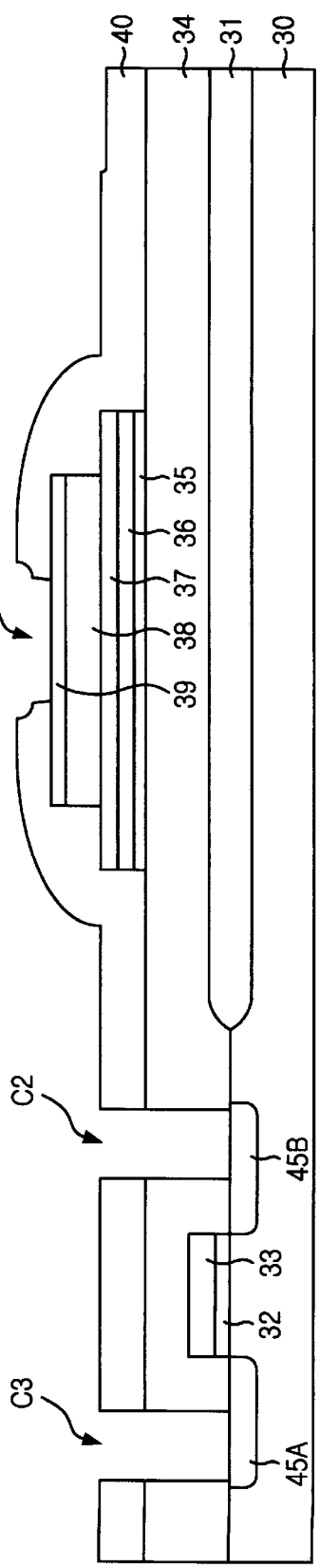

Referring to FIG. 2C, a second inter-layer insulation layer 40 is formed on the semiconductor substrate 10 completed with the capacitor formation, and selectively etched to expose the Ir capping layer 39 placed on the top electrode 38 so as to form a first contact hole C1. The second inter-layer insulation layer 40 and the first inter-layer insulation layer 34 are then selectively etched to expose the first junction 45A and the second junction 45B located at each end of the gate electrode 33, thereby forming a second and a third contact holes C2 and C3.

In this case, the second inter-layer insulation layer 40 is formed with a double layer by depositing tetra ethyl orthosilicate (TEOS) based oxide in a thickness ranging from about 20 nm to about 100 nm and borophospho silicate glass (BPSG) or phospho silicate glass (PSG) in a thickness ranging from about 100 nm to about 700 nm. A chemical vapor deposition (CVD) technique or a physical vapor deposition technique (PVD) is employed to form the second inter-layer insulation layer 40. After forming the second inter-layer insulation layer 40 or the contact holes C1, C2 and C3, it is preferable to perform a thermal process in an atmosphere of mixed gases of $N_2$ and $O_2$ at a temperature ranging from about 500° C. to about 900° C. in order to enhance a quality of the second inter-layer insulation layer 40.

Figure 2D:
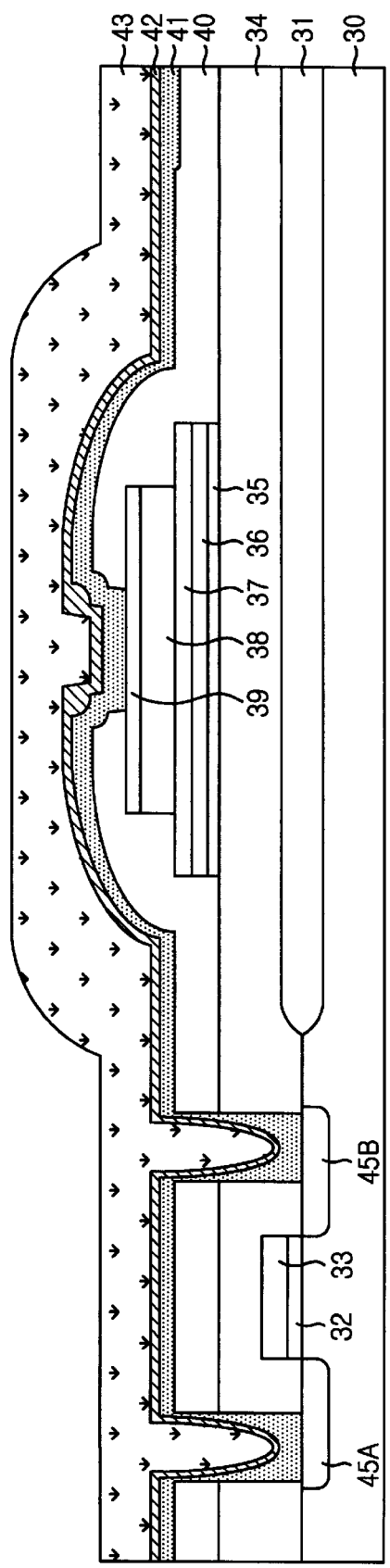

With reference to FIG. 2D, a Ti layer 41, a TiN layer 42 and a first metal layer 43 are sequentially stacked. At this time, the Ti layer 41 is formed to a thickness in a range from about 1 nm to about 50 nm, whereas the TiN layer 42 has a thickness ranging from about 2 nm to about 100 nm.

Figure 2E:
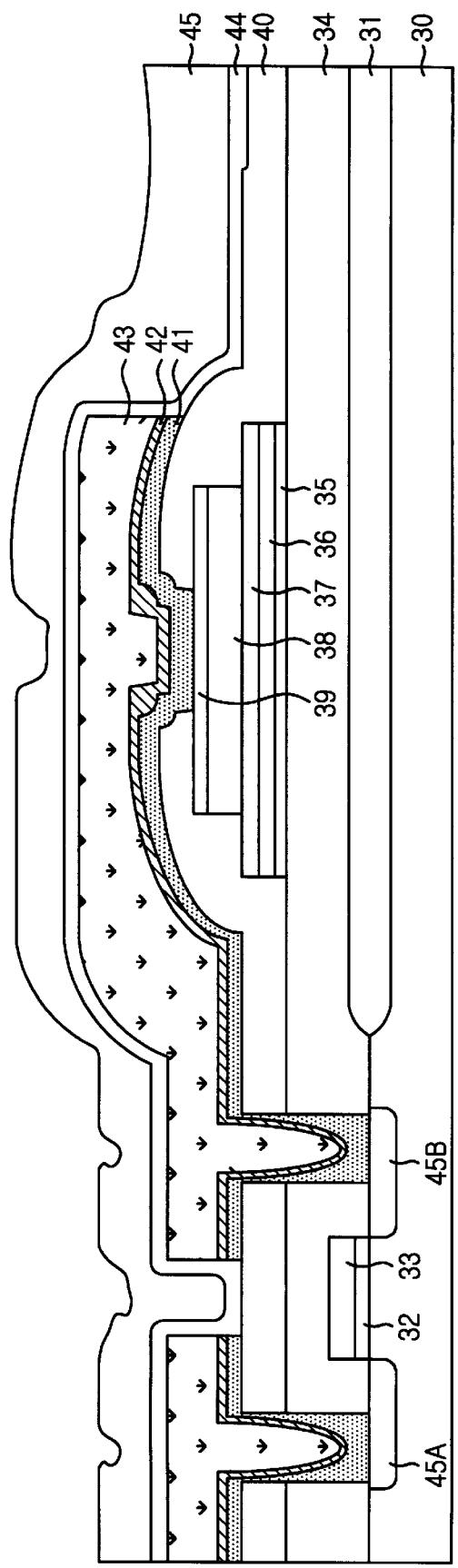

As illustrated in FIG. 2E, the first metal layer 43, the TiN layer 42, and the Ti layer 41 are simultaneously patterned so to connect the top electrode 38 and the second junction 45B. A bit line (not shown) and the first junction 45A are also connected with each other. At this time, the Ti layer 41 is connected with the second inter-layer insulation layer 40 exposed at lateral sides of the first contact hole C1 and a bottom surface of the Ir capping layer 39 so as to form a barrier for preventing diffusion of plasma including impurities such as hydrogen ions, moisture, electrons and argon ions. Additionally, in accordance with the preferred embodiment of the present invention, the first metal layer 43 can be formed with a triple layer of Ti/TiN/Al by sequentially stacking a Ti layer, a TiN layer and aluminum (Al).

In order to prevent hydrogen ion diffusion and damage from plasma, an $Al_2O_3$ layer 44 is formed to a thickness ranging from about 2 nm to about 100 nm on the first metal layer 43 through the use of a chemical vapor deposition technique (CVD), an atomic layer deposition (ALD) technique or a physical vapor deposition (PVD) technique.

An inter-metal dielectric layer 45 is formed to cover the whole structure constructed as described above. The inter-metal dielectric layer 45 is made of spin-on-glass (SOG) based triple layers, i.e., SiON, SOG, and silicon rich oxide (SRO) are sequentially deposited to thickness of about 100 nm, about 400 nm and about 400 nm, respectively. After this formation of the triple layer, a second metal layer is formed, and plasma enhanced undoped silicate glass (PE-USG) and $Si_3N_4$ are deposited to form a layer for passivation. Instead of using PE-USG, USG can be alternatively substituted.

As can be seen from the above, by performing the preferred embodiment of the present invention, there are provided advantages in that plasma, containing impurities in high energy states can be blocked from penetrating into a capacitor through an interface between inter-layer insulation layers during an etching process or a deposition process that uses plasma by forming a Ti layer on an Ir capping layer which covers a top electrode of a capacitor. Accordingly, it is possible to diminish degradation of an electric property of a semiconductor device. Ultimately, production yield of manufacturing semiconductor devices could be significantly improved.

While the present invention has been described with respect to certain preferred embodiments, it will be apparent to those skilled in the art that various changes and modifications may be made without departing from the scope of the invention as defined in the following claims.

What is claimed is:

1. A method for manufacturing a semiconductor device, comprising the steps of:

forming a capacitor including a bottom electrode, a dielectric layer and a top electrode on a semiconductor device;

forming an Ir capping layer on the top electrode of the capacitor;

forming an inter-layer insulation layer covering the Ir capping layer and the capacitor;

forming a contact hole by selectively etching the inter-layer insulation layer, wherein the inter-layer insulation layer is exposed at the lateral side of the contact hole and the Ir capping layer is exposed at the bottom surface of the contact hole;

forming a Ti layer for preventing plasma containing impurities from penetrating into the capacitor, wherein the Ti layer is contacted to the Ir capping layer at the bottom surface of the contact hole and the inter-layer insulation layer at the lateral side of the contact hole; and proceeding a process using the plasma.

2. The method as recited in claim 1, wherein the top electrode and the Ir capping layer are formed through the steps of:

forming a conductive layer for the top electrode on the dielectric layer;

forming the Ir capping layer on the conductive layer; and etching selectively the Ir capping layer and the conductive layer.

3. The method as recited in claim 2, wherein a thickness of the Ir capping layer ranges from about 20 nm to about 100 nm.

4. A method for manufacturing a semiconductor device, comprising the steps of:

preparing a semiconductor substrate on which a transistor including a gate insulation layer, a gate electrode and junctions is already formed;

forming a first inter-layer insulation layer on the semiconductor substrate;

forming a capacitor including a bottom electrode, a dielectric layer and a top electrode on the first inter-layer insulation layer;

forming an Ir capping layer on the top electrode of the capacitor;

forming a second inter-layer insulation layer on the semiconductor substrate;

forming a first contact hole by selectively etching the second inter-layer insulation layer, wherein the second inter-layer insulation layer is exposed at the lateral side of the first contact hole and the Ir capping layer is exposed at the bottom surface of the first contact hole, and forming a second contact hole by selectively etching the first and the second inter-layer insulation layers, wherein the junction of the transistor is exposed;

forming a Ti layer for preventing plasma with impurities from penetrating into the capacitor, wherein the Ti layer contacts to the Ir capping layer at a bottom surface of the first contact hole and the second inter-layer insulation layer at the lateral side of the first contact hole, and the Ti layer making an ohmic contact by contacting to the junction exposed at a bottom surface of the second contact hole;

forming a TiN layer on the Ti layer; and forming a metal line on the TiN layer.

5. The method as recited in claim 4, wherein the top electrode and the Ir capping layer are formed through the steps of:

forming a conductive layer for the top electrode, on the dielectric layer;

forming the Ir capping layer on the conductive layer; and selectively etching the Ir capping layer and the conductive layer.

6. The method as recited in claim 5, wherein a thickness of the Ti layer ranges from about 20 nm to about 100 nm.

7. The method as recited in claim 4, wherein an $Al_2O_3$ barrier is formed on the metal line.

* * * * *